(12) United States Patent
Yuze

(10) Patent No.: US 12,040,153 B2
(45) Date of Patent: Jul. 16, 2024

(54) ION GUN

(71) Applicant: ULVAC, Inc., Kanagawa (JP)

(72) Inventor: Takumi Yuze, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 315 days.

(21) Appl. No.: 17/636,162

(22) PCT Filed: Jul. 21, 2020

(86) PCT No.: PCT/JP2020/028200
§ 371 (c)(1),
(2) Date: Feb. 17, 2022

(87) PCT Pub. No.: WO2021/049175
PCT Pub. Date: Mar. 18, 2021

(65) Prior Publication Data
US 2022/0293388 A1   Sep. 15, 2022

(30) Foreign Application Priority Data

Sep. 9, 2019   (JP) .................................. 2019-163763

(51) Int. Cl.
*H01J 37/08*   (2006.01)
(52) U.S. Cl.
CPC .................................. *H01J 37/08* (2013.01)
(58) Field of Classification Search
CPC ....................................................... H01J 37/08
See application file for complete search history.

(56) References Cited

U.S. PATENT DOCUMENTS

| 6,495,842 | B1 | 12/2002 | Huttel et al. |
| 6,750,600 | B2 * | 6/2004 | Kaufman ............... H01J 27/146 313/231.71 |
| 8,134,287 | B1 * | 3/2012 | Price ................... H01J 37/3178 313/361.1 |
| 2008/0073557 | A1 | 3/2008 | German et al. |
| 2012/0025710 | A1 | 2/2012 | Klyuev et al. |
| 2012/0187843 | A1 | 7/2012 | Madocks |

(Continued)

FOREIGN PATENT DOCUMENTS

| CN | 201910395 | 7/2011 |
| JP | 2012164677 | 8/2012 |
| JP | 2014-222597 | 11/2014 |

(Continued)

OTHER PUBLICATIONS

Office Action from related Chinese Appln. No. 202080014700, dated Jan. 26, 2022. English translation attached.

(Continued)

*Primary Examiner* — Sean M Luck
(74) *Attorney, Agent, or Firm* — Grossman, Tucker, Perreault & Pfleger, PLLC

(57) ABSTRACT

An ion gun of the invention includes: an anode; a magnetic pole that has an inner surface facing the anode, a slit provided at a position corresponding to the anode, and an inner inclined surface that extends from an end of the inner surface to the slit and that forms a part of the slit; and a cover that covers at least the inner surface and the inner inclined surface, is formed of an electroconductive and non-magnetic material, and is detachable from the magnetic pole.

8 Claims, 5 Drawing Sheets

(56) References Cited

U.S. PATENT DOCUMENTS

| | | | |
|---|---|---|---|
| 2016/0148775 A1* | 5/2016 | Madocks | H01J 27/10 250/424 |
| 2017/0186581 A1* | 6/2017 | Hwang | H01J 37/08 |

FOREIGN PATENT DOCUMENTS

| | | |
|---|---|---|
| TW | 200625374 | 7/2006 |
| TW | 200814125 | 3/2008 |
| WO | 2008036266 | 3/2008 |
| WO | 2014175702 | 10/2014 |

OTHER PUBLICATIONS

International Search Report from related application PCT/JP2020/028200 mailed Oct. 6, 2020, with English translation.
Taiwan Office Action from related application TW 109124968 mailed Aug. 16, 2021, with English translation of search report.

* cited by examiner

ION GUN

TECHNICAL FIELD

The present invention relates to an ion gun.

CROSS REFERENCE TO RELATED APPLICATION

This application is a National Stage Application of PCT/JP2020/028200 filed Jul. 21, 2020, and claims priority from Japanese Patent Application No. 2019-163763 filed on Sep. 9, 2019, the contents of which are incorporated herein by reference in their entirety.

BACKGROUND ART

Conventionally, a process using an ion beam extracted from an ion gun is widely used, and such an ion gun is mounted on various apparatuses. Generally, the ion gun has a configuration that generates plasma between a slit formed at a magnetic pole (cathode) and an anode (positive pole) and that extracts an ion beam to the outside thereof through the slit (for example, refer to Patent Document 1).

PRIOR ART DOCUMENTS

Patent Documents

[Patent Document 1] United States Patent Application, Publication No. 2012/0187843

SUMMARY OF THE INVENTION

Problems to be Solved by the Invention

In recent years, a process of improving an etching rate of a target object by increasing intensity of a magnetic field of the ion gun is required. However, in such a process, there is a problem in that the magnetic pole is likely to be consumed due to plasma, the distance of the slit of the magnetic pole (gap) becomes wider, and a discharge current becomes lower. Furthermore, there is a problem in that a frequency of replacing the consumed magnetic pole with a new magnetic pole increases and maintenance becomes poor. Additionally, there is a problem in that contamination due to the material of the magnetic pole is generated along with consumption of the magnetic pole and adversely affects a process using the ion gun.

The invention was made in view of the above-described situation, and has an object to provide an ion gun that inhibits a magnetic pole from being consumed at a slit of the magnetic poles, improves a degree of maintenance therefor by reducing a frequency of replacement of the magnetic pole, and inhibits contamination due to the material of the magnetic pole from being generated.

Means for Solving the Problems

An ion gun according to an embodiment of the invention includes: an anode; a magnetic pole that has an inner surface facing the anode, a slit provided at a position corresponding to the anode, and an inner inclined surface that extends from an end of the inner surface to the slit and that forms a part of the slit; and a cover that covers at least the inner surface and the inner inclined surface, is formed of an electroconductive and non-magnetic material, and is detachable from the magnetic pole.

In the ion gun according to the embodiment of the invention, the cover may include: a first cover portion that covers the inner surface of the magnetic pole; and a second cover portion that is connected to the first cover portion and that covers the inner inclined surface.

In the ion gun according to the embodiment of the invention, the second cover portion of the cover may have a vertical surface extending in a vertical direction with respect to the anode, and vertical surfaces facing each other in the slit may be parallel to each other.

In the ion gun according to the embodiment of the invention, the inner inclined surface of the magnetic pole may have an inner end that is located at an opposite side of the end of the inner surface, and when viewed in a plan view of the ion gun, the inner end may coincide with the vertical surface of the cover.

In the ion gun according to the embodiment of the invention, the inner inclined surface of the magnetic pole may have an inner end that is located at an opposite side of the end of the inner surface, and when viewed in a plan view of the ion gun, the cover may have a protruding portion that protrudes from the inner end to the slit.

In the ion gun according to the embodiment of the invention, the magnetic pole may have an outer surface on an opposite side of the inner surface, and an outer inclined surface that extends from an end of the outer surface to the slit and that forms a part of the slit, and the cover may cover the inner surface, the inner inclined surface, the outer surface, and the outer inclined surface.

In the ion gun according to the embodiment of the invention, the material forming the cover may be selected from the group consisting of carbon, titanium, and copper. Particularly, it is preferable that the material forming the cover be carbon.

Effects of the Invention

According to the above-mentioned aspect of the invention, it is possible to inhibit a magnetic pole from being consumed at a slit of the magnetic poles, improve a degree of maintenance therefor by reducing a frequency of replacement of the magnetic pole, and inhibit contamination due to the material of the magnetic pole from being generated.

EMBODIMENTS FOR CARRYING OUT THE INVENTION

An ion gun according to an embodiment of the invention will be described with reference to the drawings. In these drawings which are utilized in the explanation of the embodiment, appropriate changes have been made in the scale of the various members, in order to represent them at scales at which they can be easily understood.

In the following description, "when viewed in a plan view" means a plan view viewed from above the ion gun and means a plan view viewed from the vertical direction of a magnetic pole 30 shown in FIG. 1 or 2 which will be described later.

Furthermore, an ordinal number such as "first", "second", or the like in the following embodiment is used to avoid constituent parts from being confused and is not limited to the number thereof.

(Linear Ion Gun)

Figure 1:
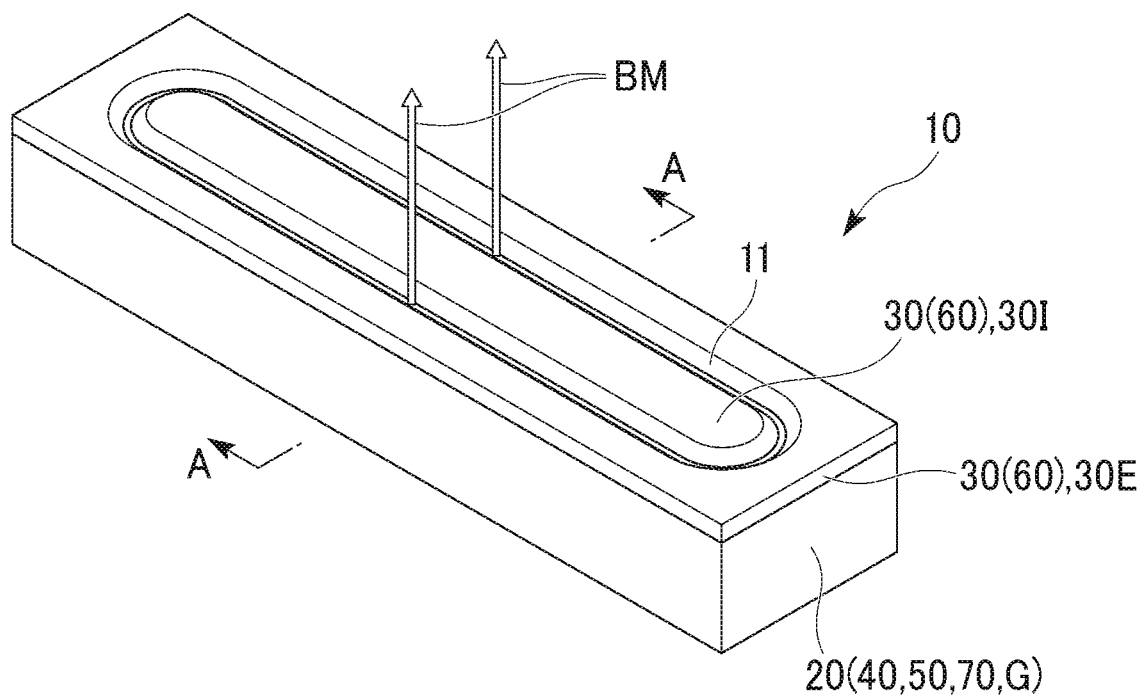
FIG. 1 is a perspective view showing a schematic configuration of a linear ion gun according to an embodiment of the invention.
Figure 2:
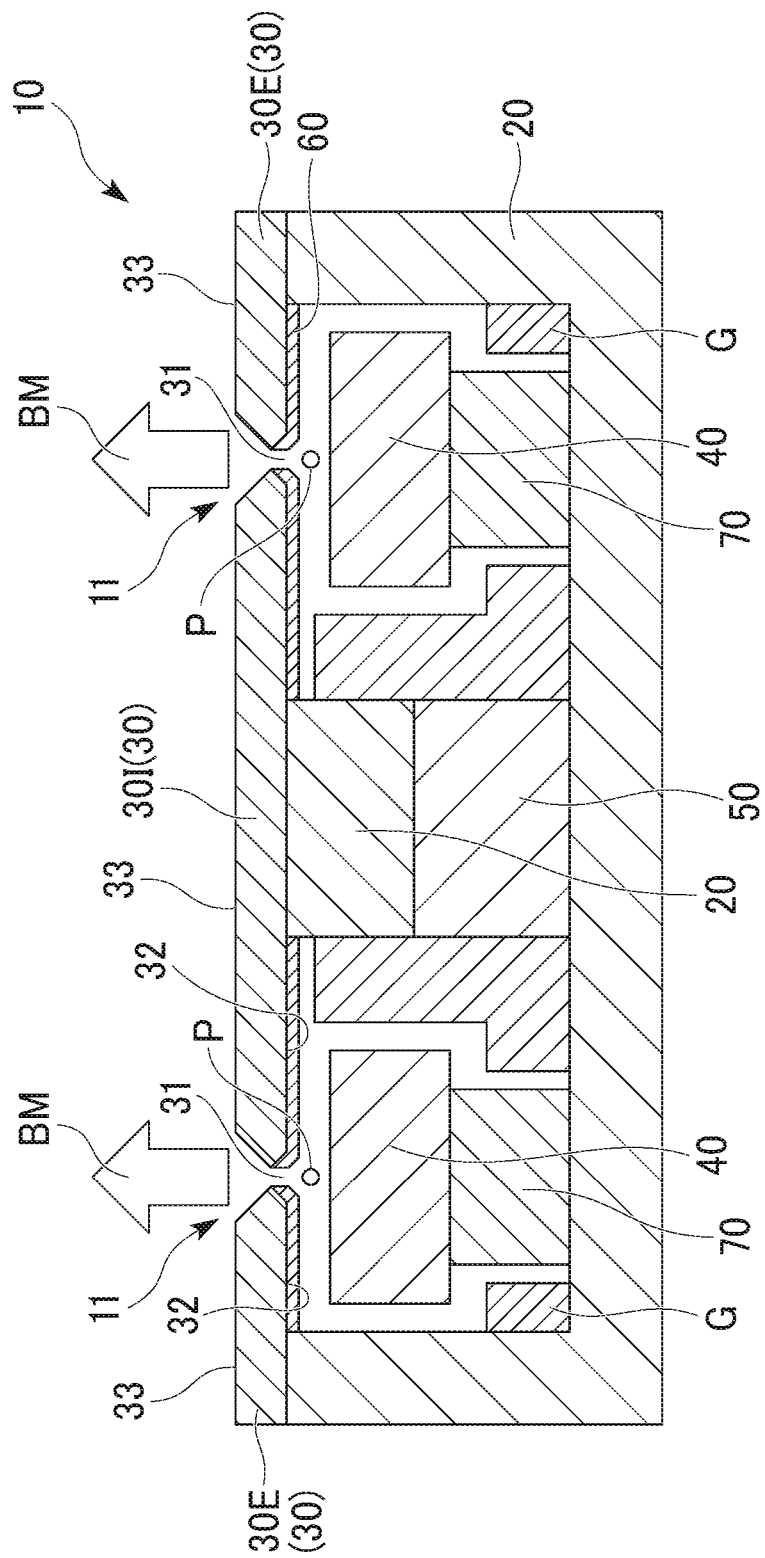
FIG. 2 is a view showing the schematic configuration of the linear ion gun according to the embodiment of the invention and is a cross-sectional view taken along line A-A shown in FIG. 1.
Figure 3:
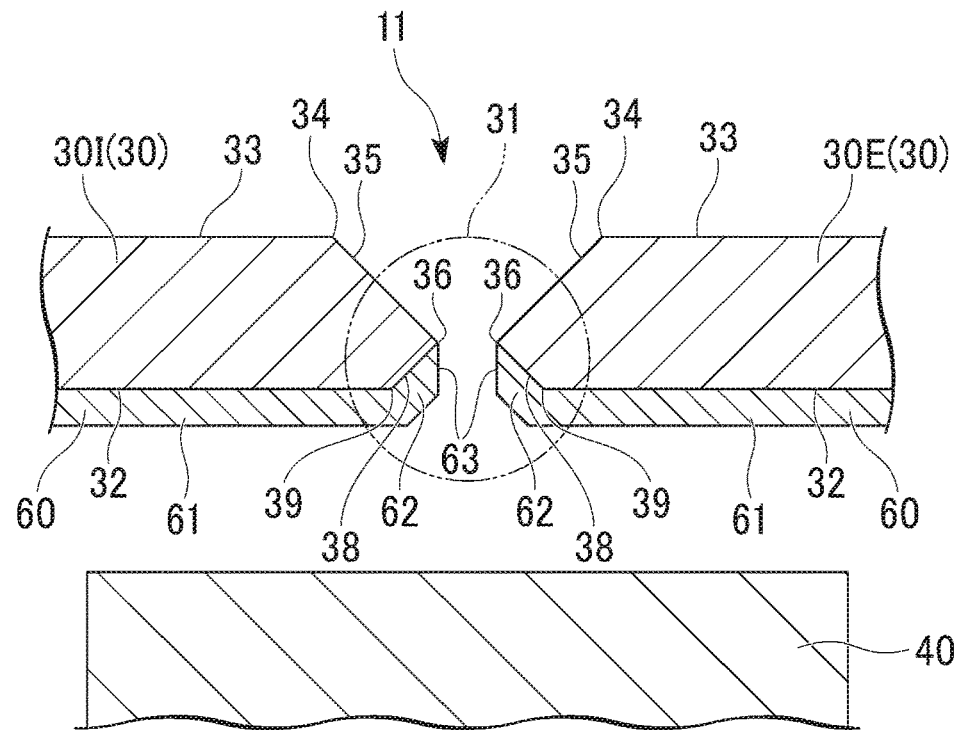
FIG. 3 is an enlarged cross-sectional view showing a relevant part of the linear ion gun according to the embodiment of the invention.

FIG. 1 is a perspective view showing a schematic configuration of a linear ion gun (ion gun) according to the embodiment of the invention. FIG. 2 is a cross-sectional view taken along the line A-A of FIG. 1. FIG. 3 is a view showing a relevant part of the linear ion gun according to the embodiment of the invention and is an enlarged cross-sectional view showing members around the slit formed at the magnetic pole.

As shown in FIG. 1, a linear ion gun 10 includes a yoke 20 and a magnetic pole 30. An anode 40, a magnet 50, an insulator 70, and a gas supply device G are disposed inside the yoke 20 (described below).

On the magnetic pole 30, a cover 60 is attached to an inner surface 32 of the magnetic pole 30 facing the anode 40 (described below).

The linear ion gun 10 has a simple configuration in which an extraction electrode such as a grid electrode or the like is not necessary, and can carry out generation of plasma P via use of one DC power source (direct current) and generation of an ion beam BM via ion acceleration. Moreover, since the linear ion gun 10 does not have a heat filament, a long-time operation is possible even under an oxygen atmosphere, a low cost is realized, and there is a high degree of reliability.

Note that, although FIG. 1 only shows the linear ion gun 10, a transfer device that transfers or swings the linear ion gun 10 may be connected to the linear ion gun 10. A configuration of the transfer device is appropriately selected depending on an apparatus using the linear ion gun 10.

As shown in FIG. 1, the linear ion gun 10 has a track-shaped opening 11 having a straight part and a curved part. The curved part (corner part) of the opening 11 has a curvature radius of, for example, 25 mm when viewed in a plan view.

(Yoke)

The yoke 20 is a frame-shaped member made of steel which surrounds the anode 40, the magnet 50, the insulator 70, and the gas supply device G. The region surrounded by the yoke 20 is covered with the magnetic pole 30.

(Magnetic Pole)

The magnetic pole 30 (cathode) has sizes such as, for example, 400 mm in entire length×100 mm in width×10 mm in height when viewed in a plan view. As a constituent material of the magnetic pole 30, a ferromagnet is preferably used, and, for example, a steel such as SS400 or the like or a stainless steel such as SUS430 or the like is used.

As shown in FIG. 3, the magnetic pole 30 has a slit 31 provided at a position corresponding to that of the anode 40. The slit 31 is provided at a position corresponding to that of the opening 11.

The magnetic pole 30 is fixed to the yoke 20 by a fastening member. By releasing the fixation by the fastening member, the magnetic pole 30 is detachable from the yoke 20. Specifically, the magnetic pole 30 includes an inner magnetic pole 30I located inside the opening 11 and an outer magnetic pole 30E located outside the opening 11.

The inner magnetic pole 30I is fixed to the yoke 20 in advance. On the other hand, the outer magnetic pole 30E is detachable from the yoke 20. It is possible to remove the outer magnetic pole 30E by releasing the fixation by the fastening member while maintaining a state in which the inner magnetic pole 30I is fixed.

Note that, as a configuration of the magnetic pole 30, each of the inner magnetic pole 30I and the outer magnetic pole 30E may be capable of being independently detachable from the yoke 20.

Furthermore, although FIG. 1 shows that the outer magnetic pole 30E is one plate member, the outer magnetic pole 30E may be configured by a plurality of plate members. In this case, each of the plate members can be independently detachable from the yoke 20 by releasing the fixation by the fastening member.

The magnetic pole 30 includes the inner surface 32 facing the anode 40 and an outer surface 33 on the opposite side of the inner surface 32. Furthermore, the magnetic pole 30 includes: an inner inclined surface 38 that extends from an end of the inner surface 32 toward the slit 31 and that forms a part of the slit 31; and an outer inclined surface 35 that extends from an end of the outer surface 33 toward the slit 31 and that forms a part of the slit.

The inner inclined surface 38 is an inclined surface that extends diagonally upward from an end portion 39 (an end, a lower end) of the inner surface 32 adjacent to the slit 31 to the center of the slit 31, and forms a part of the slit 31.

The outer inclined surface 35 is an inclined surface that extends diagonally downward from an end portion 34 (an end, an upper end) of the outer surface 33 adjacent to the slit 31 to the center of the slit 31, and forms a part of the slit 31.

The inner inclined surface 38 of the magnetic pole 30 has an inner end 36 located at the opposite side of the end portion 39 (end) of the inner surface 32. In other words, the outer inclined surface 35 of the magnetic pole 30 has the inner end 36 located at the opposite side of the end portion 34 (end) of the outer surface 33. That is, the inner end 36 is a connection end at which the inner inclined surface 38 is connected to the outer inclined surface 35.

The distance between the inner ends 36 facing each other, that is, the width of the slit 31 is approximately 3 mm. Note that, the width of the slit 31 is not limited to this value.

(Anode)

The anode 40 (positive pole) is disposed to be away from a back surface of the magnetic pole 30 so as to generate an electric field in a direction substantially perpendicular to a magnetic field generated by the magnet 50. A DC power source which is not shown in the drawings is connected to the anode 40.

As a constituent material of the anode 40, it is preferable to use a non-magnetic material.

The anode 40 is supported by the insulator 70 inside the yoke 20.

(Magnet)

The magnet 50 is formed of an SmCo (samarium cobalt) alloy and generates a magnetic field in a width direction of the slit 31. Additionally, an NdFe (neodymium iron) may be used as the magnet 50.

(Gas Supply Device)

The gas supply device G is provided inside the yoke 20 and supplies a gas such as Ar, $O_2$, or the like to the inside of the yoke 20. The gas of the gas supply device G flows toward the opening 11 through the inside of the yoke 20 and is used to generate plasma between the slit 31 of the magnetic pole 30 and the anode 40.

A water-cooling pipe which is connected to a cooling-water circulation device and is not shown in the drawings is provided around the periphery of the yoke 20 or the anode 40. As cooling medium flows to the inside of the water-cooling pipe, the magnetic pole 30 or the anode 40 is prevented from being deformed, and it is possible to drive the linear ion gun 10 without depending on a temperature.

(Cover)

The cover 60 covers the inner surface 32 and the inner inclined surface 38 of the magnetic pole 30 and is formed of an electroconductive and non-magnetic material.

The cover 60 is separated from the magnetic pole 30 and is fixed to the magnetic pole 30 by a fastening member. By releasing the fixation by the fastening member, the cover 60 is detachable from the magnetic pole 30.

The cover 60 includes: a first cover portion 61 that covers the inner surface 32 of the magnetic pole 30; and a second cover portion 62 that is connected to the first cover portion 61 and that covers the inner inclined surface 38. That is, the first cover portion 61 and the second cover portion 62 form an integrated component.

In the embodiment, the second cover portion 62 has a vertical surface 63 extending in a vertical direction with respect to the anode 40. In the slit 31, the vertical surfaces 63 facing each other are parallel to each other. The vertical surface 63 is exposed to the opening 11 in the slit 31.

In addition, when viewed in a plan view of the linear ion gun 10, the inner end 36 of the magnetic pole 30 coincides with the vertical surface 63 of the cover 60.

It is preferable that the cover 60 be formed of a material that is less likely to be eroded as compared with the material of the magnetic pole. The cover 60 is formed of an electro-conductive and non-magnetic material, and specifically, the constituent material of the cover 60 is selected from the group consisting of carbon, titanium, and copper. Particularly, it is most preferable to use carbon as such material.

Regarding the characteristics of carbon that is preferably used as the cover 60, a bending strength is preferably 34 MPa to 74 MPa, a tensile strength is preferably 22 MPa to 48 MPa, a specific resistance is preferably 11 µΩ·m to 17.5 µΩ·m, and Shore hardness is preferably 53 to 87. By using the carbon having the above-described characteristics, it is possible to form the cover 60 suitable to the embodiment.

Next, the action of the linear ion gun 10 having the above-described configuration will be described.

The linear ion gun 10 is disposed inside a chamber in which a reduced-pressure atmosphere is maintained. In the linear ion gun 10, in a state in which a gas is supplied from the gas supply device G to a space between the anode 40 and the magnetic pole 30, the DC power source applies a high direct current voltage between the anode 40 and the magnetic pole 30. Consequently, as shown in FIG. 2, the plasma P is generated between the magnetic pole 30 and the anode 40, and the ion beam BM is extracted from the opening 11.

According to the embodiment, since the inner inclined surface 38 of the magnetic pole 30 which forms the slit 31 is covered with the cover 60 in the opening 11, the inner inclined surface 38 of the magnetic pole 30 is not exposed to the slit 31. Accordingly, consumption of the inner inclined surface 38 due to exposure of the inner inclined surface 38 to plasma in the slit 31 is inhibited, and an increase in the gap of the slit 31 (the distance between the two inner ends 36) due to the consumption of the inner inclined surface 38 can be prevented. As a result, a predetermined gap of the slit 31 is maintained, and it is possible to prevent a discharge current from being lowered. Moreover, the lifetime of the magnetic pole 30 is prolonged, a frequency of replacing the used magnetic pole with a new magnetic pole is reduced, and it is possible to improve maintenance. Furthermore, as the consumption of the magnetic pole 30 is inhibited, generation of contamination due to the material of the magnetic pole 30 can be limited and does not adversely affect a process using the ion gun.

In the embodiment, the cover 60 is formed of a material that is less likely to be eroded as compared with the material of the magnetic pole and is formed of carbon. The sputtering efficiency of a carbon is substantially one-third of that of a general material of the magnetic pole and therefore is preferably used as a material of the cover 60.

Note that, although it is possible to obtain the effect of inhibiting the consumption of the magnetic pole 30 even when an operating time of the linear ion gun 10 has elapsed, in contrast, the cover 60 is sacrificially consumed. However, the cover 60 is easily detachable from the magnetic pole 30, and it is possible to replace the cover 60.

(Replacement of Cover)

When replacement of old and new covers 60 with respect to the magnetic pole 30 is carried out, firstly, the outer magnetic pole 30E is removed from the yoke 20. In this state, the cover 60 is detachable from the inner surface 32 of the outer magnetic pole 30E. Furthermore, in a state in which the outer magnetic pole 30E is removed from the yoke 20, an operator can insert the operator's fingers between the inner magnetic pole 30I and the anode 40. Consequently, the cover 60 is detachable from the inner surface 32 of the inner magnetic pole 30I.

Accordingly, it is possible to easily remove the used cover 60 from the outer magnetic pole 30E and the inner magnetic pole 30I. Thereafter, a new cover 60 not used can be easily attached to the outer magnetic pole 30E and the inner magnetic pole 30I.

Moreover, since a magnetic force (magnetic flux) of the outer magnetic pole 30E is smaller than that of the inner magnetic pole 30I, it is possible to easily carry out operation of removal and attachment of the outer magnetic pole 30E with respect to the yoke 20.

MODIFIED EXAMPLE OF EMBODIMENT

Figure 4:
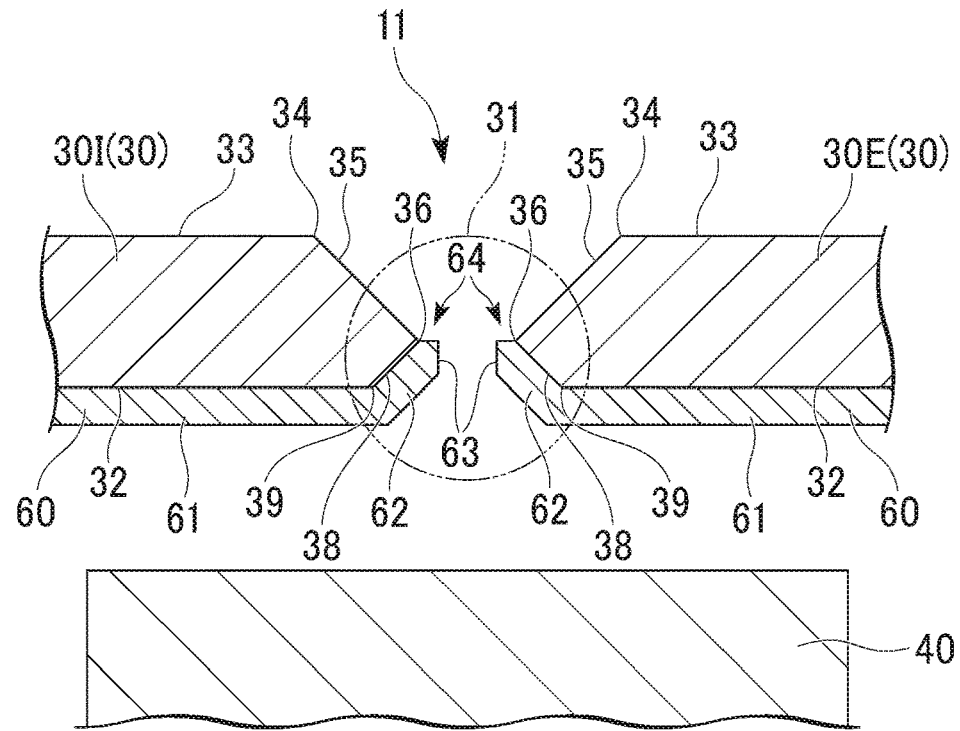
FIG. 4 is an enlarged cross-sectional view showing a relevant part of a linear ion gun according to a modified example 1 of the embodiment of the invention.
Figure 5:
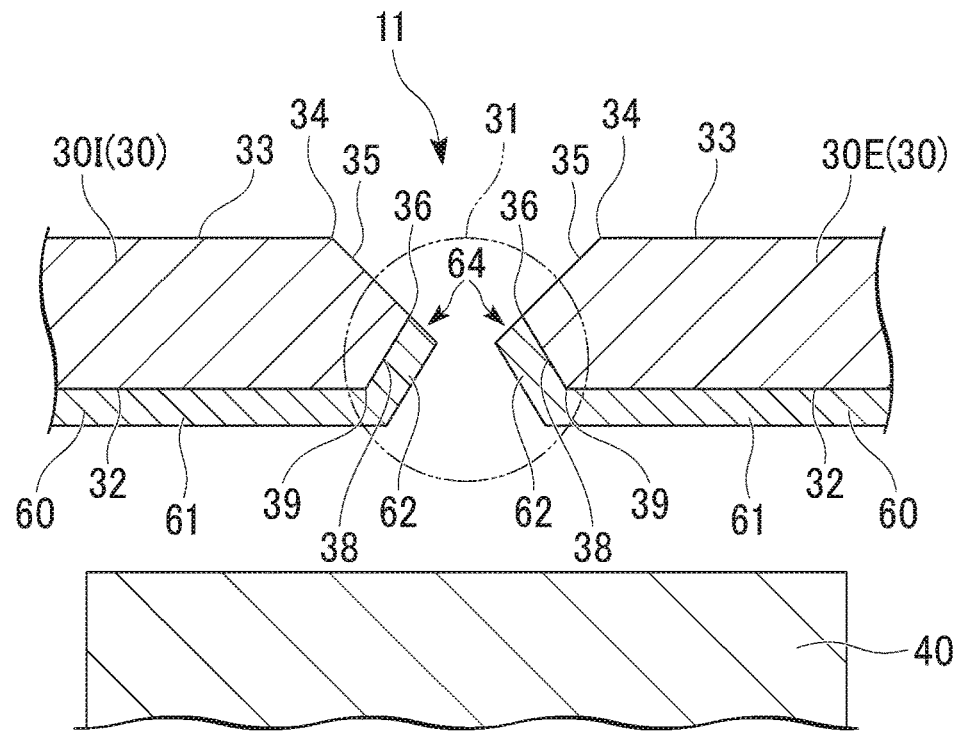
FIG. 5 is an enlarged cross-sectional view showing a relevant part of a linear ion gun according to a modified example 2 of the embodiment of the invention.
Figure 6:
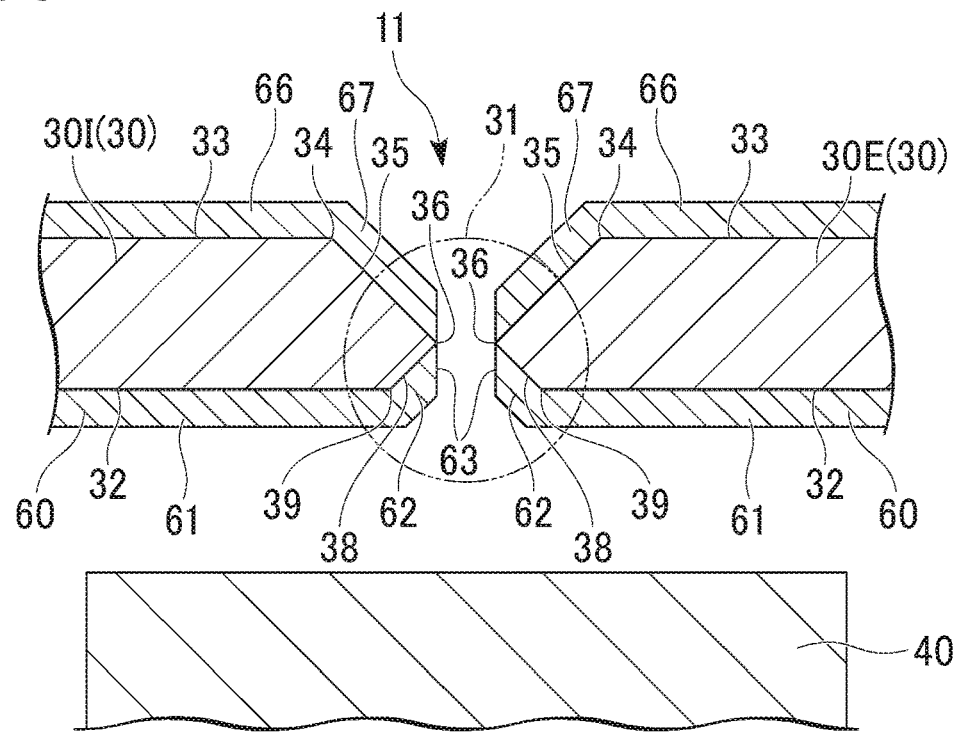
FIG. 6 is an enlarged cross-sectional view showing a relevant part of a linear ion gun according to a modified example 3 of the embodiment of the invention.

Next, linear ion guns according to modified examples of the embodiment of the invention will be described with reference to FIGS. 4 to 6. In FIGS. 4 to 6, identical reference numerals are used for the elements which are identical to those of the above-described embodiment, and the explanations thereof are omitted or simplified here. The modified examples described below are different from the aforementioned embodiment in configuration of the cover 60.

Modified Example 1

FIG. 4 is an enlarged cross-sectional view showing a relevant part of a linear ion gun according to a modified example 1 of the embodiment of the invention.

In the aforementioned embodiment, the configuration is described in which the inner end 36 of the magnetic pole 30 coincides with the vertical surface 63 of the second cover portion 62 when viewed in a plan view of the linear ion gun 10; however, the inner end 36 may not coincide with the vertical surface 63.

Specifically, in the modified example 1, the cover 60 includes a protruding portion 64 that protrudes from the inner end 36 to the inside of the opening 11 when viewed in a plan view of the linear ion gun 10.

According to the modified example 1, since the protruding portion 64 is disposed between the inner end 36 of the magnetic pole 30 and a plasma generation region, the inner end 36 is less likely to be exposed to plasma, and it is possible to further improve the effect of inhibiting the consumption of the magnetic pole 30. Accordingly, an increase in the gap of the slit 31 due to the consumption of the magnetic pole 30 can be prevented. As a result, a predetermined gap of the slit 31 is maintained, it is possible to prevent a discharge current from being lowered, and the lifetime of the magnetic pole 30 is prolonged.

Note that, a protrusion amount of the protruding portion 64, that is, a distance from the inner end 36 to the vertical surface 63 (the front end of the protruding portion 64) is appropriately determined in accordance with the frequency of replacement of the cover 60 in the maintenance of the linear ion gun 10 and the amount of the gas flowing to the outside of the linear ion gun 10 through the opening 11.

Particularly, when the protrusion amount of the protruding portion 64 increases, the frequency of replacement of the cover 60 can be reduced; however, in contrast, the opening space of the opening 11 becomes small, the conductance decreases, and the amount of the gas flowing to the opening 11 decreases. On the other hand, when the protrusion amount of the protruding portion 64 decreases, the frequency of replacement of the cover 60 increases; however, the opening space of the opening 11 increases, the conductance increases, and the amount of the gas flowing to the opening 11 increases.

That is, the protrusion amount of the protruding portion 64 and the amount of the gas required for the linear ion gun 10 are in a trade-off relationship. The protrusion amount of the protruding portion 64 is determined in consideration of this relationship.

Modified Example 2

FIG. 5 is an enlarged cross-sectional view showing a relevant part of a linear ion gun according to a modified example 2 of the embodiment of the invention.

In the aforementioned embodiment and the modified example 1, the case is described in which the cover 60 has the vertical surface 63; however, the cover 60 does not necessarily need the vertical surface 63.

As shown in FIG. 5, the second cover portion 62 of the cover 60 includes a protruding portion 64 that protrudes from the inner end 36 to the inside of the opening 11 when viewed in a plan view of the linear ion gun 10 and may include an inclined surface parallel to the inner inclined surface 38. In this case, the inclined surface of the second cover portion 62 is exposed to the opening 11 in the slit 31.

According to the modified example 2, since the protruding portion 64 is disposed between the inner end 36 of the magnetic pole 30 and a plasma generation region, the inner end 36 is less likely to be exposed to plasma, and it is possible to further improve the effect of inhibiting the consumption of the magnetic pole 30. Accordingly, an increase in the gap of the slit 31 due to the consumption of the magnetic pole 30 can be prevented. As a result, a predetermined gap of the slit 31 is maintained, it is possible to prevent a discharge current from being lowered, and the lifetime of the magnetic pole 30 is prolonged.

Note that, similarly to the modified example 1, since the protrusion amount of the protruding portion 64 and the amount of the gas required for the linear ion gun 10 are in a trade-off relationship, the protrusion amount of the protruding portion 64 is determined in consideration of this relationship.

Modified Example 3

FIG. 6 is an enlarged cross-sectional view showing a relevant part of a linear ion gun according to a modified example 3 of the embodiment of the invention.

In the aforementioned embodiment and the modified examples 1 and 2, the configuration is described in which the inner surface 32 of the magnetic pole 30 is covered with the first cover portion 61 and the inner inclined surface 38 is covered with the second cover portion 62, the cover 60 needs to at least cover the inner surface 32 and the inner inclined surface 38, and the cover 60 may cover the outer surface 33 and the outer inclined surface 35.

As shown in FIG. 6, the cover 60 includes the first cover portion 61 that covers the inner surface 32, the second cover portion 62 that covers the inner inclined surface 38, a third cover portion 66 that covers the outer surface 33, and a fourth cover portion 67 that covers the outer inclined surface 35. The fourth cover portion 67 is connected to the third cover portion 66. The third cover portion 66 and the fourth cover portion 67 form an integrated component and are fixed to the magnetic pole 30 by a fastening member. By releasing the fixation by the fastening member, the third cover portion 66 and the fourth cover portion 67 are detachable from the magnetic pole 30.

The first cover portion 61 and the second cover portion 62 form a lower cover. The third cover portion 66 and the fourth cover portion 67 form an upper cover. The lower cover and the upper cover are separated from each other, and each of the lower cover and the upper cover is fixed to the magnetic pole 30.

According to the modified example 3, it is possible to inhibit the consumption of the magnetic pole 30 on the outer surface 33 and the outer inclined surface 35, and the same effect can be obtained as that of the above-mentioned embodiment as well.

Note that, in the configuration shown in FIG. 6, the protruding portion 64 may be provided on the vertical surface 63, and the protruding portion may be provided on the vertical surface of the fourth cover portion 67. Furthermore, the protruding portion 64 shown in the modified example 2 may be applied to the modified example 3.

However, as described above, since the protrusion amount of the protruding portion 64 and the amount of the gas required for the linear ion gun 10 are in a trade-off relationship, the protrusion amount of the protruding portion 64 is determined in consideration of this relationship.

In the aforementioned embodiment and the modified examples 1 to 3, the two inner inclined surfaces 38 and the two outer inclined surfaces 35 which face each other and are axisymmetrically disposed (axial symmetry with respect to the center line of the slit) are provided inside the slit 31. In other words, in this configuration, the two corners, each of which corresponds to the inner end 36 serving as an apex and faces each other, are located inside the slit 31.

In the above-described axisymmetric configuration, since the axisymmetric shape (similarity relationship) is maintained even where the magnetic pole 30 is consumed in the slit 31, the stabilized transition (time-dependent change) of the discharge current is kept without lowering the discharge current.

The maintaining of the similarity relationship of the shape is substantially synonymous with the face that a condition (change) of the magnetic flux density generated in the slit 31 only depends on the gap of the slit 31. This means that a change in the magnetic flux profile due to a change in surface profile of the magnetic pole 30 in the slit 31 does not occur.

Regarding the gap of the slit 31 and the change in surface profile of the magnetic pole 30 in the slit 31, the inventor evaluated the contribution therebetween by simulation.

As a result, the result was obtained in which, for the purpose of stabilization of the ionic current, as compared with the change in the gap of the slit 31, maintaining the similarity relationship of the shapes of the magnetic poles 30 facing each other in the slit 31 is the dominant factor in order to realize the stabilization of the ionic current. It was determined that this evaluation result matches Example (experimental result) which will be described later.

EXAMPLES

Next, the effects of the invention will be described while referring to Example with reference to FIG. 7.

Figure 7:
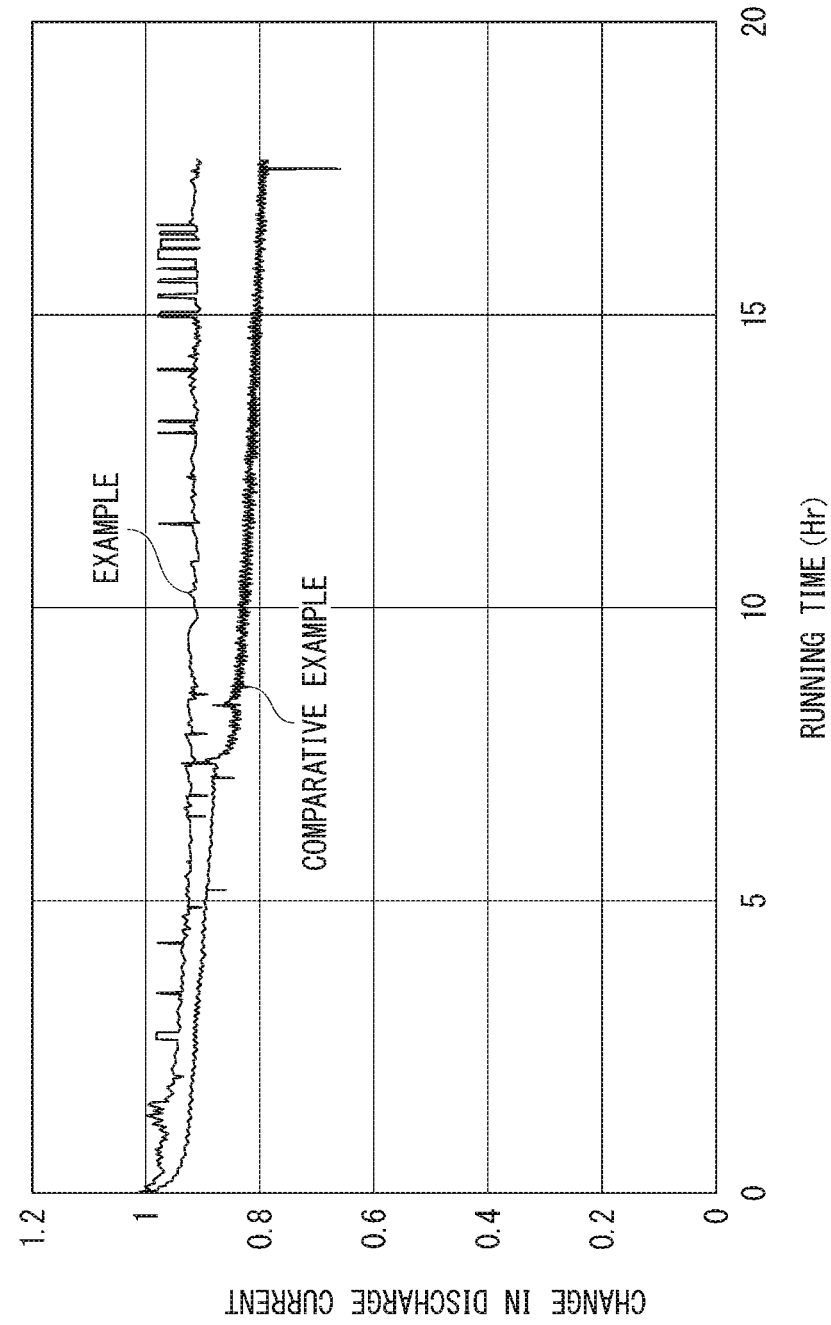
FIG. 7 is a graph showing an experimental result for explanation of Example of the invention.

FIG. 7 is a graph comparing the Comparative Example indicating a conventional linear ion gun and the Example indicating the linear ion gun including the cover according to the aforementioned embodiment applied thereto and shows a time-dependent change of the discharge current with elapsed running time (operating time). In FIG. 7, the horizontal axis shows the running time of the linear ion gun, and the vertical axis shows the change in discharge current. Specifically, the change in discharge current means a relative amount of change of the discharge current with respect to the case in which the running time is 0 hours (1, 100%).

Comparative Example

In the linear ion gun according to the Comparative Example, a configuration in which a cover is not provided at a slit of a magnetic pole, that is, a configuration in which a constituent member of the magnetic pole is exposed to the slit is applied.

In the Comparative Example, immediately after the operation started, the discharge current significantly decreased. Thereafter, the discharge current gradually decreased until the running time reached 7.5 hours. Even after the running time reached 7.5 hours, the phenomenon that the discharge current decreased continued. When the running time reached 17 hours, the amount of change of the discharge current was 0.8, and the discharge current decreased by approximately 20% as compared with before the start of the operation. Additionally, after the running time reached 17 hours, consumption of the magnetic pole of the linear ion gun according to the Comparative Example was evaluated, and it was determined that a change in shape due to consumption occurred at the portion corresponding to the inner end 36 of the magnetic pole 30 of the embodiment.

Example

In the linear ion gun according to the Example, the configuration shown in the above-described embodiment (FIG. 3) is applied.

In the Example, although the discharge current gradually decreased until the running time reaches 5 hours from the start of the operation, significant lowering of the discharge current such as shown in the Comparative Example was not determined. When the running time exceeded 5 hours, the lowering of the discharge current was not determined, and the discharge current was stabilized. When the running time reached 17 hours, the amount of change of the discharge current was 0.9, and the discharge current decreased by approximately 10% as compared with before the start of the operation.

In comparison of the Comparative Example and the Example, it was apparent that, after the running time reached 17 hours, the Example could inhibit the lowering of the discharge current by approximately 10% with respect to the Comparative Example. This means that, the configuration of providing the cover 60 shown in the above-described embodiment on the magnetic pole 30 contributes to the lowering of the discharge current.

While preferred embodiments of the invention have been described and shown above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

INDUSTRIAL APPLICABILITY

The invention is widely applicable to an ion gun that inhibits a magnetic pole from being consumed at a slit of the magnetic poles, improves a degree of maintenance therefor by reducing a frequency of replacement of the magnetic pole, and inhibits contamination due to the material of the magnetic pole from being generated.

DESCRIPTION OF REFERENCE NUMERALS 10 linear ion gun (ion gun)
11 opening
20 yoke
30 magnetic pole
30E outer magnetic pole (magnetic pole)
30I inner magnetic pole (magnetic pole)
31 slit
32 inner surface
33 outer surface
34, 39 end portion
35 outer inclined surface
36 inner end
38 inner inclined surface
40 anode
50 magnet
60 cover
61 first cover portion (cover)
62 second cover portion (cover)
63 vertical surface
64 protruding portion
66 third cover portion (cover)
67 fourth cover portion (cover)
70 insulator
BM ion beam
G gas supply device
P plasma

What is claimed is:

1. An ion gun comprising:
   an anode;
   a magnetic pole that has an inner surface facing the anode, a slit provided at a position corresponding to the anode, and an inner inclined surface that extends from an end of the inner surface to the slit and that forms a part of the slit; and
   a cover that covers at least the inner surface and the inner inclined surface, is formed of an electroconductive and non-magnetic material, and is detachable from the magnetic pole.

2. The ion gun according to claim 1, wherein
   the magnetic pole has an outer surface on an opposite side of the inner surface, and an outer inclined surface that extends from an end of the outer surface to the slit and that forms a part of the slit, and
   the cover covers the inner surface, the inner inclined surface, the outer surface, and the outer inclined surface.

3. The ion gun according to claim 1, wherein
   the material forming the cover is selected from the group consisting of carbon, titanium, and copper.

4. The ion gun according to claim 3, wherein
   the material forming the cover is carbon.

5. The ion gun according to claim 1, wherein the cover includes:
   a first cover portion that covers the inner surface of the magnetic pole; and
   a second cover portion that is connected to the first cover portion and that covers the inner inclined surface.

6. The ion gun according to claim 5, wherein
   the inner inclined surface of the magnetic pole has an inner end that is located at an opposite side of the end of the inner surface, and
   when viewed in a plan view of the ion gun, the cover has a protruding portion that protrudes from the inner end to the slit.

7. The ion gun according to claim 5, wherein
   the second cover portion of the cover has a vertical surface extending in a vertical direction with respect to the anode, and
   vertical surfaces facing each other in the slit are parallel to each other.

8. The ion gun according to claim 7, wherein
   the inner inclined surface of the magnetic pole has an inner end that is located at an opposite side of the end of the inner surface, and
   when viewed in a plan view of the ion gun, the inner end coincides with the vertical surface of the cover.

* * * * *